US007654864B2

(12) United States Patent
Ishiguro et al.

(10) Patent No.: US 7,654,864 B2
(45) Date of Patent: Feb. 2, 2010

(54) MOUNTING BRACKET STRUCTURE

(75) Inventors: Masaaki Ishiguro, Kakegawa (JP);
Fumiyoshi Ohashi, Kakegawe (JP);
Norio Watanabe, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 264 days.

(21) Appl. No.: 11/409,018

(22) Filed: Apr. 24, 2006

(65) Prior Publication Data

US 2006/0243870 A1 Nov. 2, 2006

(30) Foreign Application Priority Data

Apr. 28, 2005 (JP) .......................... P2005-132183

(51) Int. Cl.
*H01R 13/73* (2006.01)
(52) U.S. Cl. ........................ 439/573; 439/535; 248/548
(58) Field of Classification Search .............. 248/205.1, 248/301, 548, 304, 305, 309.1, 909; 211/70.1, 211/72; 254/231; 225/93, 94; 439/573, 439/535, 82, 74, 247; 52/98
See application file for complete search history.

(56) References Cited

U.S. PATENT DOCUMENTS

| 6,736,659 B1 * | 5/2004 | Wu ............................ 439/247 |
| 6,739,880 B2 * | 5/2004 | Toyota ......................... 439/74 |
| 6,824,399 B2 * | 11/2004 | Smith et al. ................... 439/82 |
| 6,988,575 B2 | 1/2006 | Takedomi |
| 7,255,597 B2 * | 8/2007 | Nakamura et al. .......... 439/573 |

FOREIGN PATENT DOCUMENTS

| JP | 2-99440 A | 4/1990 |
| JP | 2000-232716 A | 8/2000 |
| JP | 2000-350331 A | 12/2000 |
| JP | 2002-165328 A | 6/2002 |
| JP | 2002-315141 A | 10/2002 |
| JP | 2003-165398 A | 6/2003 |
| JP | 2004-328953 A | 11/2004 |
| JP | 2005-086983 A | 3/2005 |

OTHER PUBLICATIONS

Japanese Office Action dated Apr. 8, 2009.
Japanese Notification of Reason for Refusal dated Aug. 13, 2009.

* cited by examiner

*Primary Examiner*—J. Allen Shriver
*Assistant Examiner*—Todd M. Epps
(74) *Attorney, Agent, or Firm*—Sughrue Mion, PLLC

(57) ABSTRACT

When a predetermined rupture load is applied to a mounting bracket formed on an attachment part, a rupture develops in the mounting bracket, and the attachment part can be separated from a base part by this rupture. The mounting bracket, in which a slit extending in a direction intersecting a loading direction of a rupture load is formed, includes a rigid portion disposed at one side of the slit and a breakable portion disposed at the other side of the slit which is breakable because of the presence of the bolt.

7 Claims, 3 Drawing Sheets

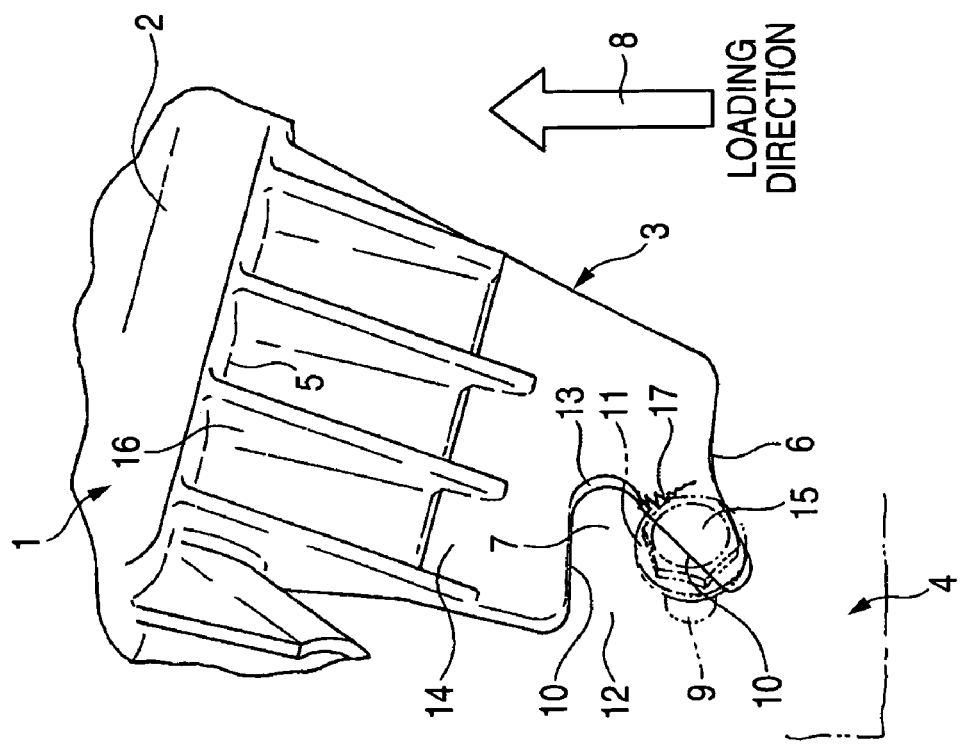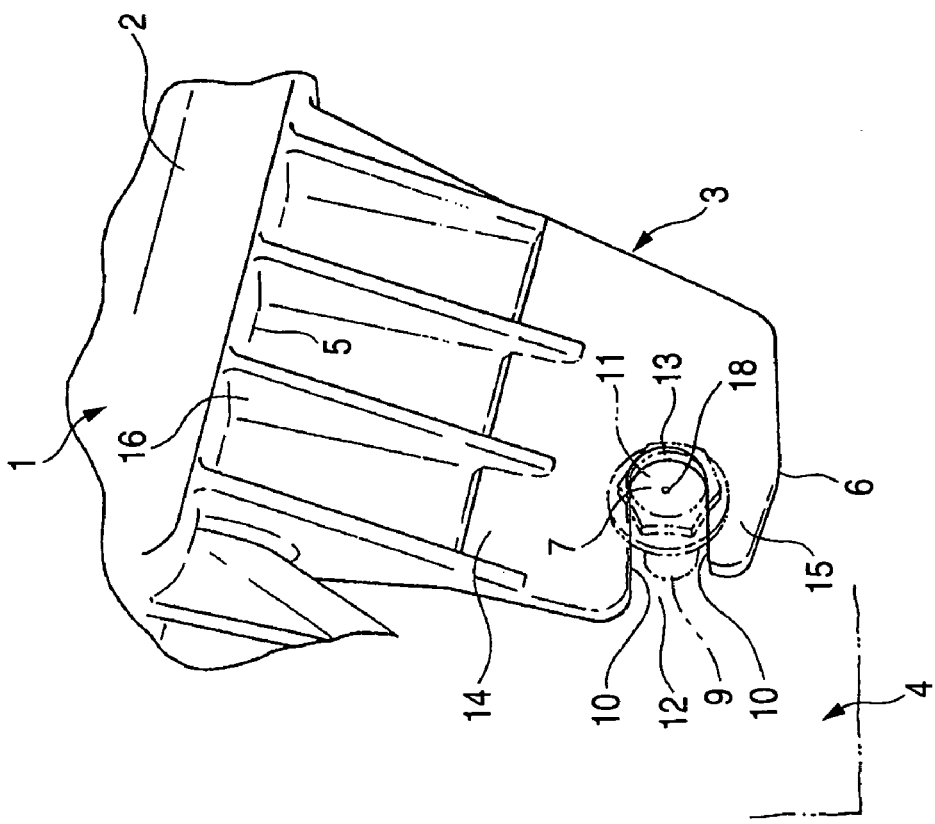

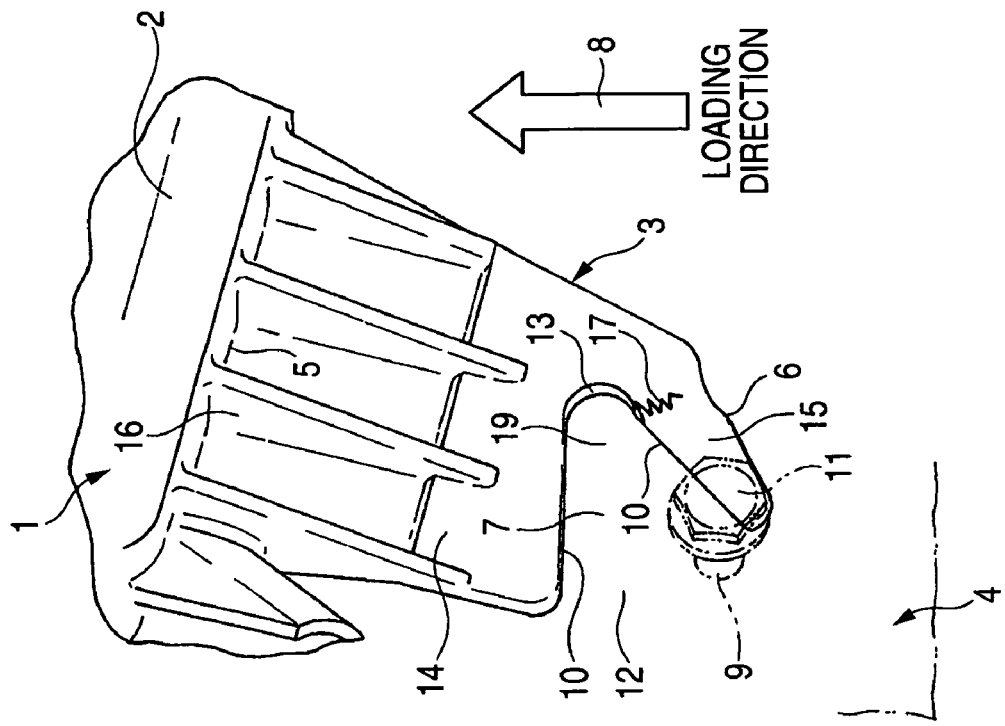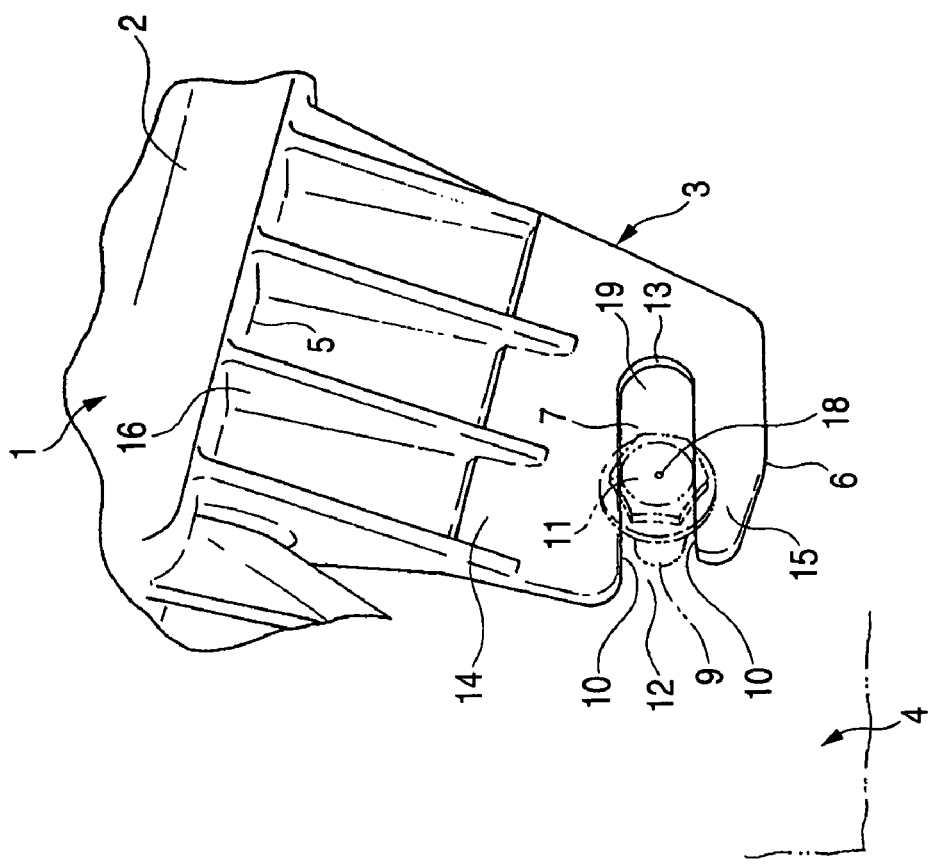

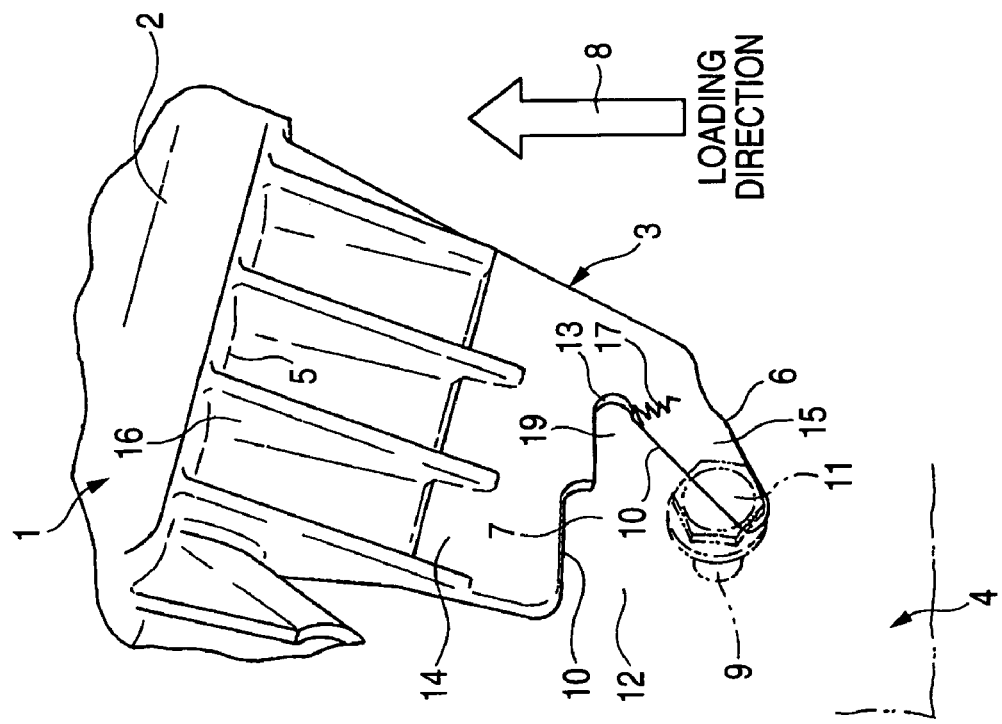
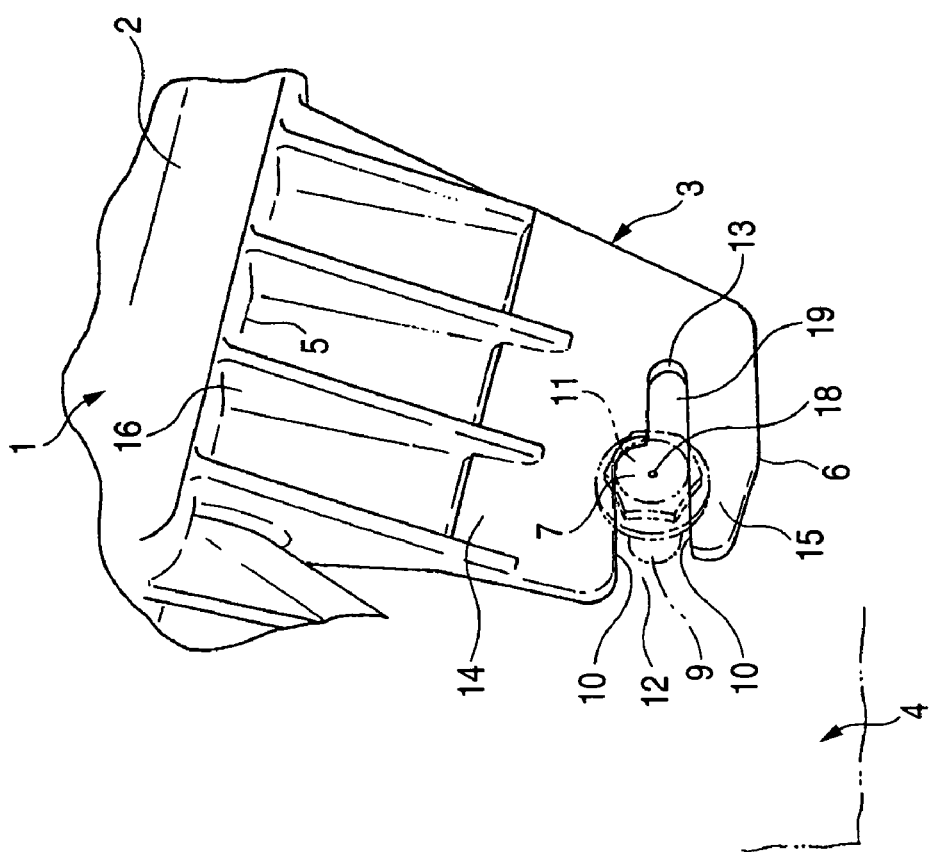

MOUNTING BRACKET STRUCTURE

BACKGROUND OF THE INVENTION

1. Field of the Invention

This invention relates to a structure for enabling an attachment part with a mounting bracket to be separated from a part-mounting portion. More specifically, the invention relates to the structure of the mounting bracket.

2. Related Art

A technique, disclosed in the following JP-A-2000-350331 Publication (Pages 2 to 3, FIGS. 1 to 3), is known as a structure for allowing only a mounting bracket to be positively broken when an accidental external force is applied, for example, to an automotive electric connection box, thereby protecting an electric connection box body. Also, a technique, disclosed in JP-A-2004-328953 Publication (Pages 4 to 5, FIGS. 1 to 2), is known as a structure in which a mounting bracket will not be broken by vibration and an impact developing during the travel of a vehicle, and the mounting bracket is broken by a predetermined rupture load only when an electric connector box body is recovered, and as a result the efficiency of the recovering operation and the recyclability are enhanced.

The two techniques are the same in that they have the structure for allowing the mounting bracket to be broken. Breaking notch portions or breaking holes are formed in the mounting brackets of the two techniques. The electric connection box is adapted to be fixed to a base part such as a vehicle panel through the mounting bracket by tightly fastening a bolt, inserted in a round through hole formed in the mounting bracket, relative to a nut threaded on this bolt. The mounting bracket begins to be broken at the notch portion or the hole portion by a rupture load exerted in a direction of the axis of the bolt.

In the structures of the above conventional techniques, when a rupture load (easily-disassembling load) is applied along the axial direction of the bolt in a fixed condition of the mounting bracket, bending stresses concentrate on the notch portion or the hole portion of the mounting bracket, so that the mounting bracket is broken. Therefore, such a structure has the following problems.

Namely, in the case where the rupture load can be applied only in a direction perpendicular to the axial direction of the bolt (here, for example, in a direction from the through hole of the mounting bracket toward an interconnecting portion connected to the electric connection box body), the development and concentration of the above bending stresses will not occur even if the notch portion or the hole portion exists between the through hole and the above interconnection portion of the mounting bracket, and therefore there is a structural problem that the mounting bracket can not be broken, and therefore the electric connection box body can be separated. And besides, there is a problem that the notch portion or the hole portion has such a structure as not to function for a rupture load applied in the above-mentioned direction.

Countermeasures as achieved by changing the disposition of the mounting bracket relative to the electric connection box body or by changing the shape of the base part greatly increase the cost because of such design change, and also affect the disposition relation to the surroundings, and these can not serve as the desirable countermeasures.

SUMMARY OF THE INVENTION

This invention has been made in view of the above circumstances, and an object of the invention is to provide a mounting bracket structure which is broken when a load is applied in a predetermined direction perpendicular to an axis of a fastening member.

(1) The above problems have been solved by a mounting bracket structure comprising:

a base part; and an attachment part having a mounting bracket that is fastened with a fasten member to the base part;

wherein the mounting bracket, in which a slit extending in a direction intersecting a loading direction of a rupture load is formed, includes a rigid portion disposed at one side of the slit and a breakable portion disposed at the other side of the slit which is breakable because of the presence of the fastening member, wherein, when a predetermined rupture load is applied to the mounting bracket of the attachment part, a rupture is developed in the mounting bracket, so that the attachment part is separated from the base portion by this rupture.

In the invention having the above features, the mounting bracket is fixed to the base part by the operation of the fastening member inserted in the slit in the mounting bracket. When a load is applied in the predetermined direction perpendicular to an axis of the fastening member in the fixed condition of the mounting bracket, stresses concentrate on one of the pair of walls forming the slit because of the presence of the fastening member. The mounting bracket is broken by this stress concentration. A crack develops in the breakable portion via the slit, so that the breaking occurs. In the invention, the slit functions as the insertion portion for the fastening member, and also functions as the portion for easily breaking the breakable portion.

In the invention, if a load is applied in a direction opposite to the above predetermined direction, the breaking of the mounting bracket is prevented by the rigidity of the rigid portion of the mounting bracket. As a result, the fixed condition of the attachment part at the base part is satisfactorily maintained. Also, if a load is applied along the direction of the axis of the fastening member, the breaking of the mounting bracket is prevented, and the fixed condition is satisfactorily maintained.

(2) The mounting bracket structure of the invention, may be further characterized in that a fastening position of the fastening member is set to a position spaced apart from an innermost portion of the slit toward an opening portion of the slit. In the invention having this feature, the more the fastening position is shifted from the innermost portion of the slit toward the opening portion thereof, the more the breaking of the breakable portion, starting from the innermost portion or its vicinity, is liable to occur.

(3) The mounting bracket structure of the invention may be further characterized in that the portion of the slit, extending from the fastening position to the innermost portion, has a width smaller than a width of the portion of the slit into which the fastening member is inserted. In the invention having this feature, that portion of the slit where the slit width changes is the fastening position.

In the invention, there is achieved an advantage that there can be provided the mounting bracket structure which is broken when a load is applied in the predetermined direction perpendicular to the axis of the fastening member. In the invention, there is achieved an advantage that the mounting bracket can be more easily broken. In the invention, there is achieved an advantage that the positioning of the fastening member can be easily effected.

BRIEF DESCRIPTION OF THE DRAWINGS

FIGS. 1A and 1B are views showing one embodiment of a mounting bracket structure of the present invention, and FIG. 1A is a perspective view showing a fixed condition of a mounting bracket, and FIG. 1B is a perspective view showing a broken condition of the mounting bracket;

FIGS. 2A and 2B are views showing another embodiment of a mounting bracket structure of the present invention, and FIG. 2A is a perspective view showing a fixed condition of a mounting bracket, and FIG. 2B is a perspective view showing a broken condition of the mounting bracket; and FIGS. 3A and 3B are views showing a further embodiment of a mounting bracket structure of the present invention, and FIG. 3A is a perspective view showing a fixed condition of a mounting bracket, and FIG. 3B is a perspective view showing a broken condition of the mounting bracket.

DETAILED DESCRIPTION OF THE PREFERRED EMBODIMENTS

Description will now be made with reference to the drawings. FIGS. 1A and 1B are views showing one embodiment of a mounting bracket structure of the present invention, and FIG. 1A is a perspective view showing a fixed condition of a mounting bracket, and FIG. 1B is a perspective view showing a broken condition of the mounting bracket.

In FIGS. 1A and 1B, an electric connection box (corresponding to "an attachment part" recited in the appended claims) for mounting on a vehicle such as an automobile includes an electric connection box body 1. The electric connection box body 1 includes a box member 2, and a plurality of circuit boards (not shown) contained in this box member 2. A housing (not shown) of a connector connecting portion for connection to a wire harness (not shown) is formed integrally with the box member 2. Also, a plurality of mounting brackets 3 (only one of which is shown here) are formed integrally with the box member 2. The electric connection box is adapted to be fixed to a base part 4 (suited for fixing a part) such as a vehicle panel and a reinforce. The structure of the mounting bracket 3 will be described below.

The mounting bracket 3 is formed into a tongue-like shape as shown in the drawings although it is not particularly limited to such a shape. The mounting bracket 3 is a generally plate-shaped portion having a predetermined thickness, and is formed such that its proximal end portion 5 is continuous with an outer surface of the box member 2. A slit 7 is formed in that portion of the mounting bracket 3 disposed near to a distal end portion 6 thereof. This slit 7 is formed in a direction intersecting a loading direction 8 in which a rupture load (described later) is applied (Here, as one example, the slit 7 is formed in a direction disposed at an angle of 90 degrees with respect to the loading direction 8). The slit 7 has such a slit width as to enable a bolt 9 (serving as a fastening member) to pass therethrough. The slit 7 has the uniform width, and extends straight (A pair of walls 10, defining the slit 7, are parallel to each other.).

When a nut 11, serving as a fastening member, is threaded on the bolt 9, the mounting bracket 3 is fixed to the base part 4 with a predetermined tightening load by the operation of the bolt 9 and nut 11. In this embodiment, the mounting bracket 3 is adapted to be fixed in a longitudinal direction of the sheet of FIGS. 1A and 1B. The bolt 4 projects perpendicularly from the surface of the part-mounting portion 4. The nut 11 may be one with a flange or may be one used with a washer.

An opening portion 12 of the slit 7 is rounded or chamfered so as to facilitate the introduction of the bolt 9. An innermost portion 13 of the slit 7 is disposed near to a center axis of the mounting bracket 3. The innermost portion 13 of the slit 7 is formed into an arc-shape conforming to the shape of the bolt 9 (The position and shape of the innermost portion 13 of the slit 7 are given merely as one example. With respect to the shape, it may be formed, for example, into a shape having a corner portion for causing a crack 17 (described later) to easily develop.).

The mounting bracket 3 has a rigid portion 14 and a breakable portion 15 formed respectively on opposite sides of the slit 7. In other words, the rigid portion 14 and the breakable portion 15 are formed in such a manner that the slit 7 is disposed therebetween. The rigid portion 14 is formed close to the proximal end portion 5. The breakable portion 15 is formed close to the distal end portion 6.

A plurality of reinforcing ribs 16 of a right triangle-shape are formed on the rigid portion 14. One side of each of the plurality of reinforcing ribs 16 is formed integrally on the outer surface of the box member 2. Because of the provision of the plurality of reinforcing ribs 16, the mounting bracket 3 has such a structure that it is less liable to be deformed with respect to a load to push the mounting bracket 3 along the axis of the bolt 9. Also, because of the provision of the plurality of reinforcing ribs 16, the mounting bracket 3 has such a structure that it is less liable to be deformed with respect to a load to push one wall 10 of the slit 7 toward the proximal end portion 5.

The breakable portion 15 is formed into a cantilever-like projecting shape (as shown in the drawings) by the other wall 10 of the slit 7, the portion forming the opening portion 12 of the slit 7, and an edge extending from this portion to the distal end portion 6 of the mounting bracket 3. The breakable portion 15 is formed such that the distance from the innermost portion 13 to the distal end portion 6 is much smaller than the distance from the innermost portion 13 to the proximal end portion 5. The breakable portion 15 is formed into such a shape that stresses, developing upon application of a rupture load (described later), concentrate on that portion of the breakable portion 15 disposed at the innermost portion 13, although the breakable portion 15 is not particularly limited to such a shape.

Next, an operation, related to the breaking of the mounting bracket 3, will be described based on the above construction. As shown in FIG. 1A, the mounting bracket 3 is fixed to the base part 4, using the bolt 9 and the nut 11. In this condition, when a predetermined rupture load (load for causing the breaking) is applied in the loading direction 8 as shown in FIG. 1B, the whole of the mounting bracket 3 receives a force tending to move this mounting bracket 3 in the loading direction 8. At this time, because of the presence of the bolt 9, the other wall 10 (the lower wall 10 in the drawings) of the slit 7 is caught by the bolt 9, and as a result the rupture load acts on the breakable portion 15 disposed at the lower side of the slit 7. Therefore, in the configuration of this embodiment, the stresses concentrates on that portion disposed at the innermost portion 13 of the slit 7, and the crack 17 develops, so that the breakable portion 15 is broken. In a condition in which the breakable portion 15 is completely broken, the electric connection box body 1 is separated from the base part 4.

As described above, in the structure of the present invention, when the predetermined rupture load (load for causing the breaking) is applied in the loading direction 8, the mounting bracket 3 can be easily broken. Here, referring to an additional advantage of the present invention, the invention can provide the structure contributing to "Law related to Recycling of Used Cars, etc." (Car Recycling Law).

Next, another embodiment of a mounting bracket structure of the invention will be described with reference to FIGS. 2A and 2B. FIG. 2A is a perspective view showing a fixed condition of a mounting bracket, and FIG. 2B is a perspective view showing a broken condition of the mounting bracket. Those portions, basically identical to those of the embodiment of FIGS. 1A and 1B, will be designated by identical reference numerals, respectively, and explanation thereof will be omitted.

In FIGS. 2A and 2B, the mounting bracket 3 has a slit 7 which is formed therein in the same position as that of the slit 7 of FIGS. 1A and 1B, and is slightly longer than it. The slit 7 of FIGS. 2A and 2B is formed such that it includes a gap portion 19 is disposed between a fastening position 18 (where a bolt 9 and a nut 11 are fastened together) and an innermost portion 13. The mounting bracket 3 of FIGS. 2A and 2B has the slit 7 including the gap portion 19, and therefore the development of a crack 17 is accelerated, using the principle of the lever, and a breakable portion 15 can be broken more easily as compared with the embodiment of FIGS. 1A and 1B.

Next, a further embodiment of a mounting bracket structure of the invention will be described with reference to FIGS. 3A and 3B. FIG. 3A is a perspective view showing a fixed condition of a mounting bracket, and FIG. 2B is a perspective view showing a broken condition of the mounting bracket. Those portions, basically identical to those of the embodiment of FIGS. 2A and 2B, will be designated by identical reference numerals, respectively, and explanation thereof will be omitted.

In FIGS. 3A and 3B, a slit 7, which is generally equal in length to the slit 7 of FIGS. 2A and 2B, is formed in the mounting bracket 3. The slit 7 of FIGS. 3A and 3B is formed such that it includes a gap portion 19 disposed between a fastening position 18 (where a bolt 9 and a nut 11 are fastened together) and an innermost portion 13. That portion of the slit 7 of FIGS. 3A and 3B, extending from the fastening position 18 to the innermost portion 13, has a reduced slit width so that the fastening position 18 can be easily seen (The positioning can be easily effected.). The mounting bracket 3 of FIGS. 3A and 3B has the slit 7 including the gap portion 19, and therefore as in the embodiment of FIGS. 2A and 2B, the development of a crack 17 is accelerated, using the principle of the lever, and a breakable portion 15 can be easily broken.

In the present invention, various modifications can be made without departing from the subject matter of the invention.

With respect to examples to which the present invention can be applied, besides the above-mentioned vehicular electric connection box, an electronic control box, a protector, etc., for a vehicle are given as examples of the attachment part. The base part is not particularly limited in so far as it is a portion, a member or others to which the attachment part can be fixed. Examples of the electric connection box include a junction block and a relay block.

What is claimed is:

1. A mounting bracket structure comprising:
   a base part; and
   an attachment part having a mounting bracket that is fastened with a fasten member to the base part;
   wherein the mounting bracket, in which a slit extending in a direction intersecting a loading direction of a rupture load is formed, includes a rigid portion disposed at one side of the slit and a breakable portion disposed at the other side of the slit which is breakable because of the presence of the fastening member,
   wherein the slit has a width so as to enable the fastening member to pass therethrough with the breakable portion in an unbroken state, and
   when a predetermined rupture load is applied to the mounting bracket of the attachment part, a rupture is developed in the mounting bracket, so that the attachment part is separated from the base portion by this rupture;
   wherein the slit includes an opening portion at one end with the breakable portion in the unbroken state.

2. A mounting bracket structure according to claim 1, wherein in the unbroken state, a fastening position of the fastening member is set to a position spaced apart from an innermost portion of the slit toward the opening portion of the slit.

3. A mounting bracket structure according to claim 2, wherein, with the breakable portion in the unbroken state, a first portion of the slit extending from the fastening position to the innermost portion has a width smaller than a width of a second portion of the slit into which the fastening member is inserted.

4. A mounting bracket structure according to claim 2, wherein, with the breakable portion in the unbroken state, the innermost portion is opposite the opening portion of the slit where the fasten member can pass through.

5. A mounting bracket structure according to claim 1, wherein, with the breakable portion in the unbroken state, the slit is U-shaped.

6. A mounting bracket structure according to claim 1, wherein, with the breakable portion in the unbroken state, the width of the slit enables the fastening member to pass therethrough along a length of the slit.

7. A mounting bracket structure according to claim 1, wherein the breakable portion comprises a cantilever shape.

* * * * *